(12) United States Patent
Kim et al.

(10) Patent No.: US 8,617,924 B2
(45) Date of Patent: *Dec. 31, 2013

(54) STACKED INTEGRATED CIRCUIT PACKAGE-IN-PACKAGE SYSTEM AND METHOD OF MANUFACTURE THEREOF

(75) Inventors: OhSug Kim, AnYang-Si (KR); Jong-Woo Ha, Seoul (KR); Jong Wook Ju, Icheon-Si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/612,603

(22) Filed: Nov. 4, 2009

(65) Prior Publication Data

US 2010/0044849 A1 Feb. 25, 2010

Related U.S. Application Data

(63) Continuation of application No. 11/608,829, filed on Dec. 9, 2006, now Pat. No. 7,635,913.

(51) Int. Cl.
*H01L 21/44* (2006.01)
*H01L 23/02* (2006.01)

(52) U.S. Cl.
USPC .......................................... 438/109; 257/686

(58) Field of Classification Search
USPC .................. 257/777, 774, 773, 784, 723, 686, 257/E21.18, E23.001, 666
See application file for complete search history.

(56) References Cited

U.S. PATENT DOCUMENTS

| | | | |
|---|---|---|---|
| 5,309,026 A | 5/1994 | Matsumoto | |
| 5,679,978 A | 10/1997 | Kawahara et al. | |
| 5,854,507 A | 12/1998 | Miremadi et al. | |
| 5,998,864 A | 12/1999 | Khandros et al. | |
| 6,072,239 A | 6/2000 | Yoneda et al. | |
| 6,353,265 B1 * | 3/2002 | Michii | 257/777 |
| 6,414,396 B1 | 7/2002 | Shim et al. | |
| 6,424,031 B1 | 7/2002 | Glenn | |
| 6,445,064 B1 | 9/2002 | Ishii et al. | |
| 6,627,480 B2 | 9/2003 | Kim | |
| 6,686,656 B1 | 2/2004 | Koh et al. | |
| 6,750,080 B2 | 6/2004 | Masuda et al. | |
| 6,753,599 B2 * | 6/2004 | Kim | 257/686 |

(Continued)

FOREIGN PATENT DOCUMENTS

| | | | |
|---|---|---|---|
| JP | 11307675 A | 11/1999 | |
| JP | 2001223297 A | 8/2001 | |

(Continued)

OTHER PUBLICATIONS

Notice of Allowance for Taiwan Application No. 96146011 dated Mar. 25, 2011.

(Continued)

*Primary Examiner* — Hoa B Trinh

(74) *Attorney, Agent, or Firm* — Ishimaru & Associates LLP; I-Chang John Yang

(57) ABSTRACT

A method of manufacture of a stacked integrated circuit package-in-package system includes forming a substrate with a top contact, mounting a first device having a first terminal over the substrate, stacking a second device having a second terminal over the first device in an offset configuration, connecting the first terminal to the top contact below the first terminal, and connecting the second terminal to the top contact below the second terminal.

16 Claims, 3 Drawing Sheets

(56) References Cited

U.S. PATENT DOCUMENTS

| | | |
|---|---|---|
| 7,061,087 B2 | 6/2006 | Kim |
| 7,071,547 B2 | 7/2006 | Kang et al. |
| 7,078,264 B2 | 7/2006 | Yang |
| 7,105,919 B2 | 9/2006 | Kim |
| 7,116,002 B2 | 10/2006 | Chao et al. |
| 7,196,415 B2 | 3/2007 | Zhong et al. |
| 7,224,070 B2* | 5/2007 | Yang ............................ 257/777 |
| 7,622,333 B2* | 11/2009 | Kim et al. ..................... 438/123 |
| 7,683,467 B2* | 3/2010 | Jang et al. ..................... 257/686 |
| 2001/0031513 A1 | 10/2001 | Masuda et al. |
| 2002/0033527 A1 | 3/2002 | Huang et al. |
| 2002/0079570 A1 | 6/2002 | Ho et al. |
| 2002/0105069 A1 | 8/2002 | Kawahara et al. |
| 2002/0113325 A1 | 8/2002 | Kim |
| 2003/0102567 A1 | 6/2003 | Eskildsen |
| 2005/0067694 A1 | 3/2005 | Pon et al. |
| 2006/0189033 A1 | 8/2006 | Kim |
| 2007/0278643 A1 | 12/2007 | Yee |
| 2008/0006925 A1 | 1/2008 | Yim et al. |
| 2008/0029866 A1 | 2/2008 | Kim et al. |
| 2008/0029867 A1 | 2/2008 | Kim et al. |
| 2008/0054435 A1 | 3/2008 | Mehta et al. |
| 2008/0136005 A1 | 6/2008 | Lee et al. |
| 2008/0136006 A1 | 6/2008 | Jang et al. |

FOREIGN PATENT DOCUMENTS

| | | |
|---|---|---|
| JP | 2002009235 A | 1/2002 |
| JP | 2002033441 A | 1/2002 |
| JP | 2005302815 A | 10/2005 |
| JP | 2005317862 A | 11/2005 |
| TW | 516141 | 1/2003 |

OTHER PUBLICATIONS

Office Action for Japan Application No. 2007-317313 dated Apr. 19, 2011.

* cited by examiner

STACKED INTEGRATED CIRCUIT PACKAGE-IN-PACKAGE SYSTEM AND METHOD OF MANUFACTURE THEREOF

CROSS-REFERENCE TO RELATED APPLICATIONS

This application is a continuation of U.S. patent application Ser. No. 11/608,829, filed Dec. 9, 2006 now U.S. Pat. No. 7,635,913. The related application is assigned to STATS ChipPAC Ltd.

The present application contains subject matter related to concurrently filed U.S. patent application Ser. No. 11/608,827, now U.S. Pat. No. 7,772,683. The related application is assigned to STATS ChipPAC Ltd.

The present application also contains subject matter related to concurrently filed U.S. patent application Ser. No. 11/608,826. The related application is assigned to STATS ChipPAC Ltd.

TECHNICAL FIELD

The present invention relates generally to integrated circuit packages and more particularly to stacked integrated circuit package-in-package system.

BACKGROUND ART

Electronics demand more integrated circuits in an integrated circuit package while paradoxically providing less physical space in the system for the increased integrated circuits content. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

Modern electronics, such as smart phones, personal digital assistants, location based services devices, servers, and storage arrays, are packing more integrated circuits into an ever-shrinking physical space with expectations for decreasing cost. Numerous technologies have been developed to meet these requirements. Some of the research and development strategies focus on new package technologies while others focus on improving the existing package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever-demanding integration of today's integrated circuits and packages.

Numerous package approaches stack multiple integrated circuit dice or package in package (PIP) or a combination thereof. The electrical connections to the each of the stacked integrated circuit require an increased amount of space from by spacers, such as silicon or interposers, or by the space required for the electrical connections, such as wire loops for bond wires. Current spacers require additional steps and structures increasing manufacturing costs and decreasing manufacturing yields. These spacers also limit the amount of height reduction. Space required for the different electrical connection types limit the overall size, e.g. height, width, and length, of the package.

Thus, a need still remains for a stacked integrated circuit package-in-package system providing low cost manufacturing, improved yield, and decreased size for the integrated circuit package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of a stacked integrated circuit package-in-package system including forming a substrate with a top contact, mounting a first device having a first terminal over the substrate, stacking a second device having a second terminal over the first device in an offset configuration, connecting the first terminal to the top contact below the first terminal, and connecting the second terminal to the top contact below the second terminal.

The present invention provides a stacked integrated circuit package-in-package system including a substrate with a top contact; a first device having a first terminal over the substrate; a second device having a second terminal over the first device in an offset configuration; a first internal interconnect between the first terminal and the top contact below the first terminal; and a second internal interconnect between the second terminal and the top contact below the second terminal.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
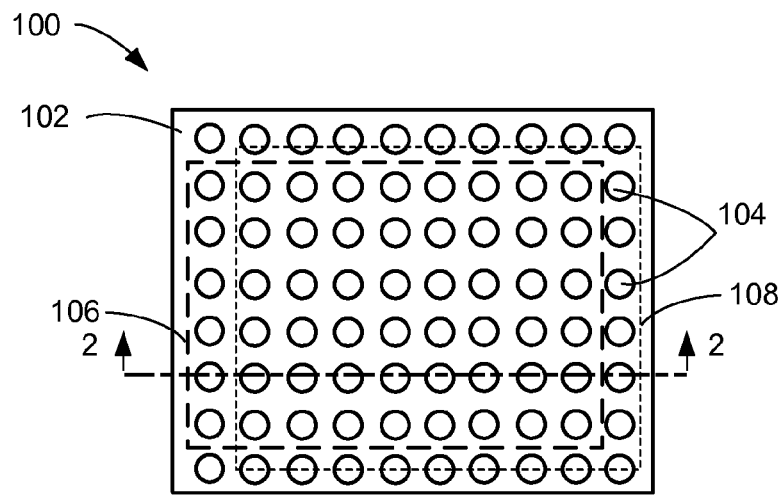
FIG. 1 is a plan view of a stacked integrated circuit package-in-package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure. The term "system" as used herein means and refers to the method and to the apparatus of the present invention in accordance with the context in which the term is used.

Referring now to FIG. 1, therein is shown a plan view of a stacked integrated circuit package-in-package system 100 in an embodiment of the present invention. The stacked integrated circuit package-in-package system 100 includes a substrate 102, such as a laminate substrate. External interconnects 104, such as solder balls, are in the substrate 102.

A first device 106, such as a packaged device or an integrated circuit die, is over the external interconnects 104. A second device 108, such as a packaged device or an integrated circuit die, is in an offset configuration with the first device 106. The second device 108 is also over the external interconnects 104.

For illustrative purposes, the first device 106 and the second device 108 are shown different sizes, although it is understood that the first device 106 and the second device 108 may not be different. Also for illustrative purposes, the external interconnects 104 are shown in an array configurations, although it is understood that the external interconnects 104 may be in a different configuration.

Figure 2:
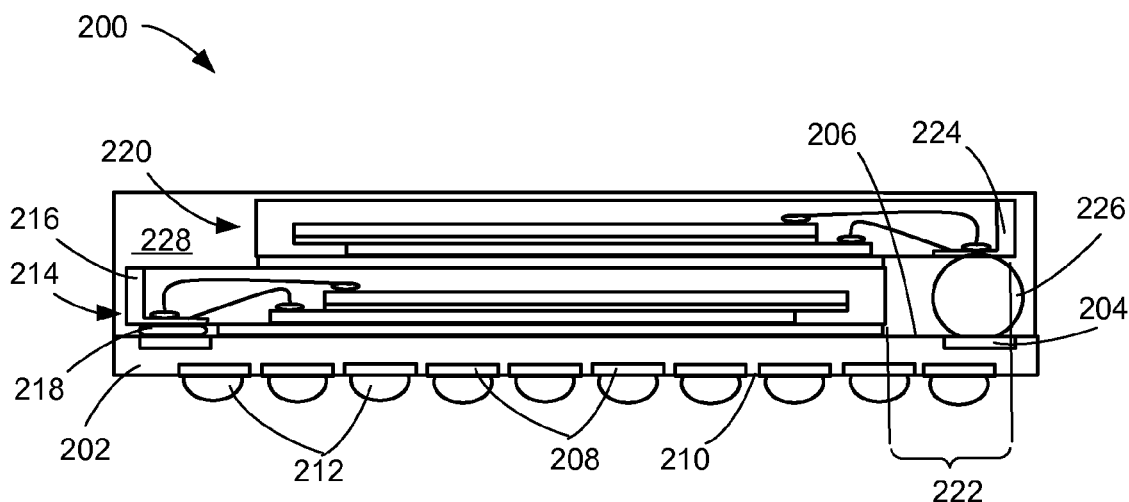
FIG. 2 is a cross-sectional view of a stacked integrated circuit package-in-package system along a line segment 2-2 of FIG. 1 in an embodiment of the present invention.

Referring now to FIG. 2, therein is shown a cross-sectional view of a stacked integrated circuit package-in-package system 200 along a line segment 2-2 of FIG. 1. The stacked integrated circuit package-in-package system 200 may represent the structure of the stacked integrated circuit package-in-package system 100 of FIG. 1. The stacked integrated circuit package-in-package system 200 packs more devices while decreasing overall package size, simplifying manufacturing process, increasing yield, and reducing the overall cost.

A substrate 202 includes top contacts 204 at a top surface 206 and bottom contacts 208 at a bottom surface 210. External interconnects 212 attach to the bottom contacts 208. For illustrative purposes, the substrate 202 is shown as having the top contacts 204 and the bottom contacts 208, although it is understood that the substrate 202 may have other structures, such as one or more routing layers or electrical vias.

A first device 214 having first terminals 216, such as terminal pads with substantially vertical portions or terminals in a shape of an "L", is over the top surface 206. The first terminals 216 can preferably extend to top and bottom extents of the first device 214. First internal interconnects 218, such as solder paste, connect the first terminals 216 and the top contacts 204 below the first terminals 216.

A second device 220 is stacked above the first device 214 in the offset configuration. The offset configuration provides an overhang 222 of the second device 220 over the first device 214. The overhang 222 exposes second terminals 224, such as terminal pads with substantially vertical portions or terminals in a shape of an "L", of the second device 220. The second terminals 224 can preferably extend to top and bottom extents of the second device 220. The overhang 222 provides a predetermined clearance from the first device 214 not to impede connections of second internal interconnects 226, such as a solder ball or a conductive post, to the second terminals 224. The second internal interconnects 226 also connect to the top contacts 204 below the second terminals 224.

A package encapsulation 228, such as an epoxy molding compound, covers the first device 214, the second device 220, the first internal interconnects 218, the second internal interconnects 226, and the top surface 206. For illustrative purposes, the package encapsulation 228 is described completely covering the second device 220, although it is understood that the package encapsulation 228 may expose a portion of the second device 220.

The first device 214 and the second device 220 may be tested without assembly in the stacked integrated circuit package-in-package system 200 ensuring known good devices (KGD), increasing yield, and lowering cost. The offset configuration provides both the first terminals 216 and the second terminals 224 access to the top contacts 204 directly below for connections. The connections to the top contacts 204 eliminate space required on the top surface 206 for wire loops of the needed for bond wires (not shown) resulting in a smaller width package.

Figure 3:
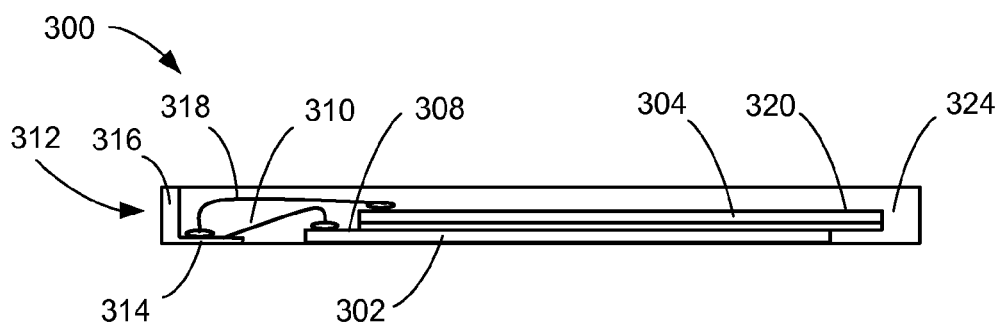
FIG. 3 is a cross-sectional view of a device in an embodiment of the present invention.

Referring now to FIG. 3, therein is shown a cross-sectional view of a device 300 in an embodiment of the present invention. The device 300, such as a stackable integrated circuit package system, may represent or have similar structure to the first device 214 of FIG. 2 or the second device 220 of FIG. 2. The device 300 has a first integrated circuit die 302 below a second integrated circuit die 304 in an offset configuration. For illustrative purposes, the device 300 is described having the first integrated circuit die 302 and the second integrated circuit die 304, although it is understood that the device 300 may have other types of devices, such as passive devices or packaged devices.

The offset configuration exposes a portion of a first active side 308 of the first integrated circuit die 302. First interconnects 310, such as bond wires, connect between the first active side 308 and device terminals 312, such as terminal pads. The device terminals 312 have an L-shape configuration with a base portion 314 and a post portion 316. The base portion 314 is the base of the "L" of the device terminals 312. The post portion 316 is connected to the base portion 314 and is the vertical portion of the "L" of the device terminals 312.

The second integrated circuit die 304 is over the first integrated circuit die 302 in an offset exposing the portion of the first active side 308. Second interconnects 318, such as bond wires, connect a second active side 320 of the second integrated circuit die 304 and the device terminals 312.

A device encapsulation 324, such as an epoxy mold compound, covers the first integrated circuit die 302, the second integrated circuit die 304, the first interconnects 310, and the second interconnects 318. The device encapsulation 324 partially covers the device terminals 312 with the base portion 314 and the post portion 316 exposed.

Figure 4:
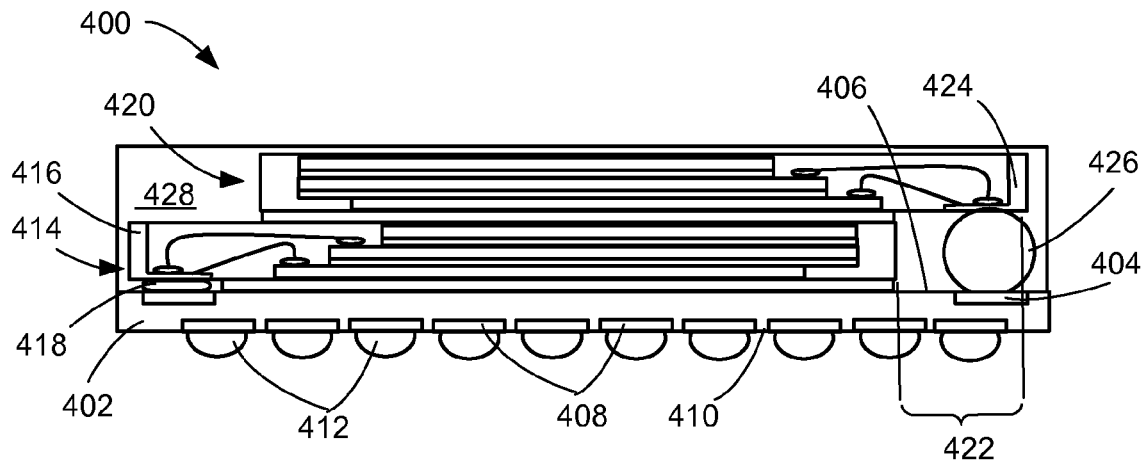
FIG. 4 is a cross-sectional view of a stacked integrated circuit package-in-package system along a line segment 2-2 of FIG. 1 in an alternative embodiment of the present invention.

Referring now to FIG. 4, therein is shown a cross-sectional view of a stacked integrated circuit package-in-package system 400 along a line segment 2-2 of FIG. 1 in another alternative embodiment of the present invention. The stacked integrated circuit package-in-package system 400 has a similar structure to the stacked integrated circuit package-in-package system 100 of FIG. 1.

A substrate 402, such as a laminate substrate, includes top contacts 404 at a top surface 406 and bottom contacts 408 at a bottom surface 410. External interconnects 412, such as solder balls, attach to the bottom contacts 408. For illustrative purposes, the substrate 402 is shown as having the top contacts 404 and the bottom contacts 408, although it is understood that the substrate 402 may have other structures, such as one or more routing layers or electrical vias.

A first device 414, such as a packaged device or an integrated circuit die, is over the top surface 406. First terminals 416, such as terminal pads, of the first device 414 are over the top contacts 404. First internal interconnects 418, such as solder paste, connect the first terminals 416 and the top contacts 404 below the first terminals 416.

A second device 420 is stacked above the first device 414 in the offset configuration. The offset configuration provides an overhang 422 of the second device 420 over the first device 414. The overhang 422 exposes second terminals 424, such as terminal pads, of the second device 420. The overhang 422 provides a predetermined clearance from the first device 414 not to impede connections of second internal interconnects 426, such as solder balls or conductive posts, to the second terminals 424. The second internal interconnects 426 also connect to the top contacts 404 below the second terminals 424.

A package encapsulation 428, such as an epoxy molding compound, covers the first device 414, the second device 420, the first internal interconnects 418, the second internal interconnects 426, and the top surface 406. For illustrative purposes, the package encapsulation 428 is described completely covering the second device 420, although it is understood that the package encapsulation 428 may expose a portion of the second device 420.

The first device 414 and the second device 420 may be tested without assembly in the stacked integrated circuit package-in-package system 400 ensuring known good devices (KGD), increasing yield, and lowering cost. The offset configuration provides both the first terminals 416 and the second terminals 424 access to the top contacts 404 directly below for connections. The connections to the top contacts 404 eliminate space required on the top surface 406 for wire loops needed for bond wires (not shown) resulting in a smaller width package.

Figure 5:
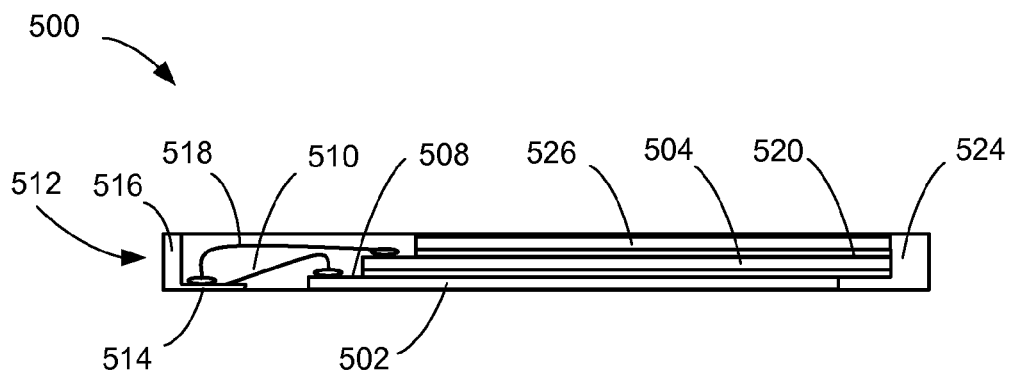
FIG. 5 is a cross-sectional view of a device in an alternative embodiment of the present invention.

Referring now to FIG. 5, therein is shown a cross-sectional view of a device 500 in another alternative embodiment of the present invention. The device 500, such as a stackable integrated circuit package system, may represent or have similar structure to the first device 414 of FIG. 4 or the second device 420 of FIG. 4. The device 500 has a first integrated circuit die 502 below a second integrated circuit die 504 in an offset configuration. For illustrative purposes, the device 500 is described having the first integrated circuit die 502 and the second integrated circuit die 504, although it is understood that the device 500 may have other types of devices, such as passive devices or packaged devices.

The offset configuration exposes a portion of a first active side 508 of the first integrated circuit die 502. First interconnects 510, such as bond wires, connect between the first active side 508 and device terminals 512, such as terminal pads. The device terminals 512 have an L-shape configuration with a base portion 514 and a post portion 516. The base portion 514 is the base of the "L" of the device terminals 512. The post portion 516 is connected to the base portion 514 and is the vertical portion of the "L" of the device terminals 512.

The second integrated circuit die 504 is over the first integrated circuit die 502 in an offset exposing the portion of the first active side 508. Second interconnects 518, such as bond wires, connect a second active side 520 of the second integrated circuit die 504 and the device terminals 512.

A stiffener 526, such as a dummy die or a heat spreader, is over the second active side 520 without impeding the connections of the second interconnects 518. The stiffener 526 provides additional planar rigidity mitigating or eliminating warpage of the device 500. The stiffener 526 may be optionally connected to a ground providing additional ground connection sites (not shown). The ground connection also allows the stiffener 526 to functions as an electromagnetic interference (EMI) shield.

A device encapsulation 524, such as an epoxy mold compound, covers the first integrated circuit die 502, the second integrated circuit die 504, the first interconnects 510, and the second interconnects 518. The device encapsulation 524 partially covers the device terminals 512 and the stiffener 526. The device encapsulation 524 partially covers the device terminals 512 with the base portion 514 and the post portion 516 exposed.

Figure 6:
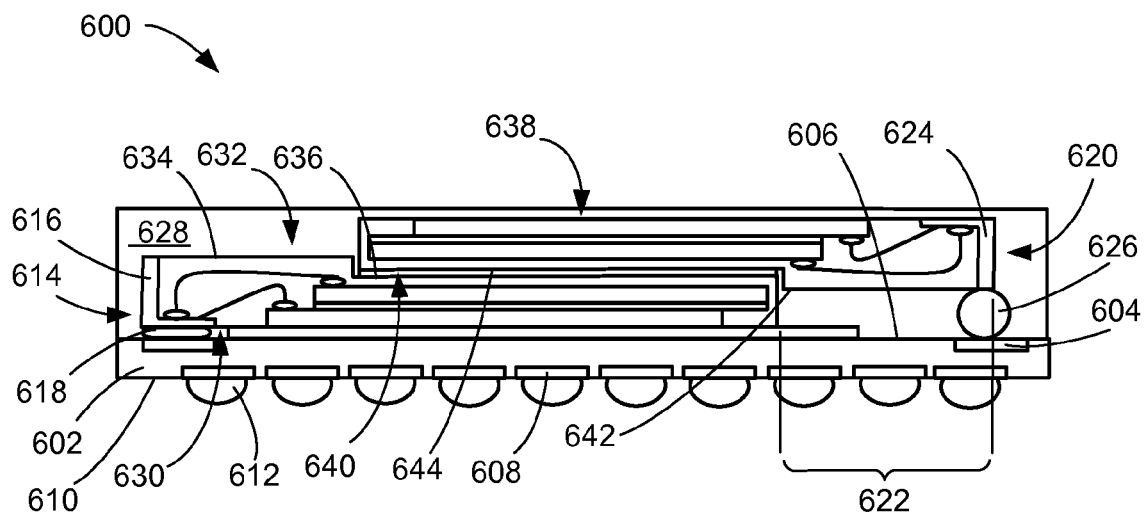
FIG. 6 is a cross-sectional view of a stacked integrated circuit package-in-package system along a line segment 2-2 of FIG. 1 in another alternative embodiment of the present invention.

Referring now to FIG. 6, therein is shown a cross-sectional view of a stacked integrated circuit package-in-package system 600 along a line segment 2-2 of FIG. 1 in another alternative embodiment of the present invention. The stacked integrated circuit package-in-package system 600 has a similar structure to the stacked integrated circuit package-in-package system 100 of FIG. 1.

A substrate 602, such as a laminate substrate, includes top contacts 604 at a top surface 606 and bottom contacts 608 at a bottom surface 610. External interconnects 612, such as solder balls, attach to the bottom contacts 608. For illustrative purposes, the substrate 602 is shown as having the top contacts 604 and the bottom contacts 608, although it is understood that the substrate 602 may have other structures, such as one or more routing layers or electrical vias.

A first device 614, such as a packaged device or an integrated circuit die, has a first planar side 630 and a first non-planar side 632 at a side opposite the first planar side 630. The first device 614 is over the top surface 606 with the first planar side 630 facing the top surface 606. First internal interconnects 618, such as solder paste, connect first terminals 616, such as terminal pads, of the first device 614 and the top contacts 604 below the first terminals 616.

The first non-planar side 632 has a first terminal level 634 at substantially the same level as the first terminals 616 and a first recess level 636 that is recessed from the first terminal level 634. For illustrative purposes, the first non-planar side 632 is shown as stepped with the first terminal level 634 and the first recess level 636, although it is understood that the first non-planar side 632 may have a different configuration, such as multiple levels, beveled, or interlocking levels.

A second device 620, such as a packaged device or an integrated circuit die, has a second planar side 638 and a second non-planar side 640 at a side opposite the second planar side 638. The second non-planar side 640 has a second terminal level 642 at substantially the same level as second terminals 624, such as terminal pads, of the second device 620 and a second recess level 644 that is recessed from the second terminal level 642. For illustrative purposes, the second non-planar side 640 is shown as stepped with the second terminal level 642 and the second recess level 644, although it is understood that the second non-planar side 640 may have a different configuration, such as multiple levels, beveled, or interlocking levels.

The second device 620 is stacked above the first device 614 in the offset configuration with the second recess level 644 attached to the first recess level 636 with an adhesive 646. The offset configuration provides an overhang 622 of the second device 620 over the first device 614 exposing the second terminals 624. The overhang 622 provides a predetermined clearance from the first device 614 not to impede connections of second internal interconnects 626, such as solder balls or conductive posts, to the second terminals 624. The second internal interconnects 626 also connect to the top contacts 604 below the second terminals 624.

A package encapsulation 628, such as an epoxy molding compound, covers the first device 614, the second device 620, the first internal interconnects 618, the second internal interconnects 626, and the top surface 606. For illustrative purposes, the package encapsulation 628 is described completely covering the second device 620, although it is understood that the package encapsulation 628 may expose a portion of the second device 620.

The first device 614 and the second device 620 may be tested without assembly in the stacked integrated circuit package-in-package system 600 ensuring known good devices (KGD), increasing yield, and lowering cost. The offset configuration provides both the first terminals 616 and the second terminals 624 access to the top contacts 604 directly below for connections. The connections to the top contacts 604 eliminate space required on the top surface 606 for wire loops needed for bond wires (not shown) reducing the width the stacked integrated circuit package-in-package system 600. The complementary surfaces of the first non-planar side 632 and the second non-planar side 640 minimizes the height of the stacked integrated circuit package-in-package system 600.

Figure 7:
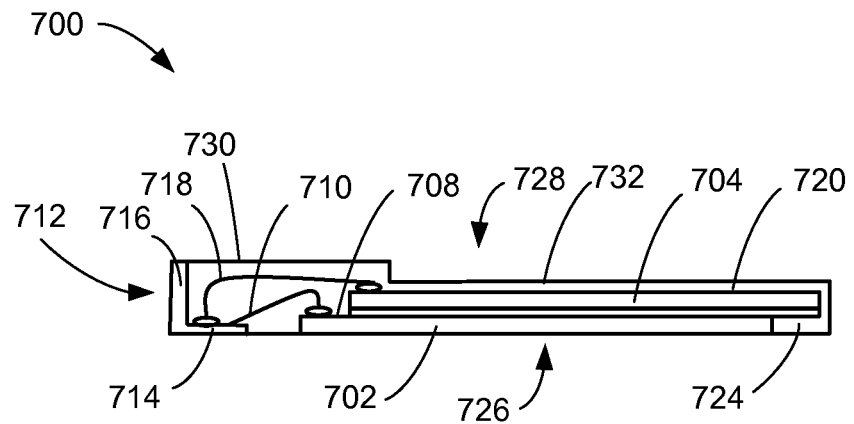
FIG. 7 is a cross-sectional view of a device in another alternative embodiment of the present invention.

Referring now to FIG. 7, therein is shown a cross-sectional view of a device 700 in an embodiment of the present invention. The device 700, such as a stackable integrated circuit package system, may represent or have similar structure to the first device 614 of FIG. 6 or the second device 620 of FIG. 6. The device 700 has a first integrated circuit die 702 below a second integrated circuit die 704 in an offset configuration. For illustrative purposes, the device 700 is described having the first integrated circuit die 702 and the second integrated circuit die 704, although it is understood that the device 700 may have other types of devices, such as passive devices or packaged devices.

The offset configuration exposes a portion of a first active side 708 of the first integrated circuit die 702. First interconnects 710, such as bond wires, connect between the first active side 708 and device terminals 712, such as terminal pads. The device terminals 712 have an L-shape configuration with a base portion 714 and a post portion 716. The device terminals 712 are adjacent to the first integrated circuit die 702. The base portion 714 is the base of the "L" of the device terminals 712. The post portion 716 is connected to the base portion 714 and is the vertical portion of the "L" of the device terminals 712.

The second integrated circuit die 704 is over the first integrated circuit die 702 in an offset exposing the portion of the first active side 708. Second interconnects 718, such as bond wires, connect a second active side 720 of the second integrated circuit die 704 and the device terminals 712.

A device encapsulation 724, such as an epoxy mold compound, covers the first integrated circuit die 702, the second integrated circuit die 704, the first interconnects 710, and the second interconnects 718. The device encapsulation 724 partially covers the device terminals 712 with the base portion 714 and the post portion 716 exposed.

The first integrated circuit die 702 is on a planar side 726 of the device 700. A side opposite the planar side 726 is a non-planar side 728. The device encapsulation 724 at the non-planar side 728 has a terminal level 730 and a recess level 732. The terminal level 730 is substantially the same level as the device terminals 712. The recess level 732 is recessed or stepped down from the terminal level 730. For illustrative purposes, the non-planar side 728 is shown as stepped with the terminal level 730 and the recess level 732, although it is understood that the non-planar side 728 may have a different configuration, such as multiple levels, beveled, or interlocking levels.

The terminal level 730 provides the height of the device 700 for the wire loops of the first interconnects 710 and the second interconnects 718. The recess level 732 reduces the height of the device 700 where the additional space for the wire loops are not needed.

Figure 8:
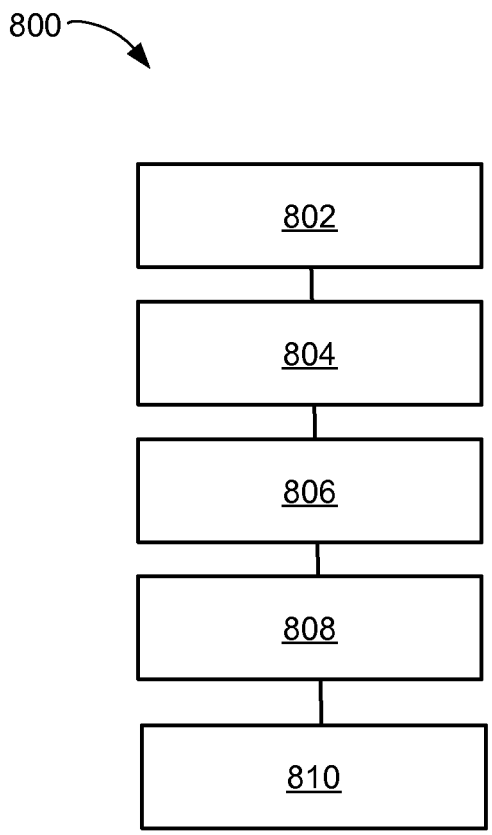
FIG. 8 is a flow chart of a method of manufacture of the stacked integrated circuit package-in-package system in an embodiment of the present invention.

Referring now to FIG. 8, therein is shown a flow chart of a method 800 of manufacture of the stacked integrated circuit package-in-package system 100 in an embodiment of the present invention. The method 800 includes: forming a substrate with a top contact in a block 802; mounting a first device having a first terminal over the substrate in a block 804; stacking a second device having a second terminal over the first device in an offset configuration in a block 806; connecting the first terminal to the top contact below the first terminal in a block 808; and connecting the second terminal to the top contact below the second terminal in a block 810.

It has been discovered that the present invention thus has numerous aspects.

A principle aspect that has been unexpectedly discovered is that the present invention provides a stacked integrated circuit package-in-package system with reduced height and width, improved thermal performance, improved EMI performance, and improved reliability performance. The offset configuration of the stacked devices utilizing electrical connects below the stacked device provides the width reduction. The non-planar complementary sides of the stacked devices provide the height reduction.

Another aspect is that the present invention provides device connections to the substrate below the stacked devices in an offset configuration. The offset configuration provides an overhang of the upper device stacked above the lower device exposing the terminals of the upper device. The overhang provides a predetermined clearance for connections from the upper device terminals to the contacts of the substrate below the terminals, wherein the connections are formed with solder balls. The lower device terminals connect to the contacts below with solder paste. These connections from the stacked devices to contacts directly below reduce the width of the package-in-package.

Yet another aspect of the present invention provides complementary non-planar sides of the stacked devices along with offset configuration resulting in a lower height of the package-in-package.

Yet another aspect of the present invention provides an EMI shield between the stacked devices and for the overall stacked package-in-package device.

Yet another aspect of the present invention provides improved yield of the overall stacked package-in-package device. The stacked devices in the stacked package-in-package device may be tested ensuring known good device before assembly of the stacked package-in-package device.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the stacked integrated circuit package-in-package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

Thus, it has been discovered that the stacked integrated circuit package-in-package system method of the present invention furnishes important and heretofore unknown and unavailable solutions, capabilities, and functional aspects for improving thermal performance, reducing EMI, and reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

What is claimed is:

1. A method of manufacturing a stacked integrated circuit package-in-package comprising:
   forming a substrate with a first top contact and a second contact top;
   mounting a first device having a first terminal over the substrate, wherein the first terminal is directly above the first top contact;
   stacking a second device having a second terminal over the first device in an offset configuration, wherein the second terminal is directly above the second top contact;
   connecting a first internal interconnect between the first terminal and the first top contact directly below the first terminal; and
   connecting a second internal interconnect between the second terminal and the second top contact directly below the second terminal.

2. The method as claimed in claim 1 further comprising forming the first device including forming a device encapsulation with a non-planar side.

3. The method as claimed in claim 1 further comprising forming the first device having a stiffener in a device encapsulation.

4. The method as claimed in claim 1 further comprising:
   forming the first device with a first device encapsulation having a first non-planar side; and
   forming the second device with a second device encapsulation having a second non-planar side complementary to the first non-planar side.

5. The method as claimed in claim 1 further comprising encapsulating the first device and the second device.

6. A method of manufacturing a stacked integrated circuit package-in-package comprising:
   forming a laminate substrate with a first top contact and a second top contact;
   mounting a first device having a first terminal and a first device encapsulation over the substrate, wherein the first terminal is directly above the first top contact;
   stacking a second device having a second terminal and a second device encapsulation over the first device in an offset configuration, wherein the second terminal is directly above the second top contact;
   connecting a first internal interconnect between the first terminal and the first top contact directly below the first terminal; and
   connecting a second internal interconnect including a solder ball between the second terminal and the second top contact directly below the second terminal.

7. The method as claimed in claim 6 further comprising:
   forming the first device encapsulation with a first terminal level and a first recess level;
   forming the second device encapsulation with a second terminal level and a second recess level; and
   attaching the first recess level and the second recess level.

8. The method as claimed in claim 6 further comprising:
   forming the first device having a stiffener; and
   connecting the stiffener to a ground connection for providing an electromagnetic shield.

9. A stacked integrated circuit package-in-package comprising:
   a substrate with a first top contact and a second top contact;
   a first device having a first terminal over the substrate, wherein the first terminal is directly above the first top contact;
   a second device having a second terminal over the first device in an offset configuration, wherein the second terminal is directly above the second top contact;
   a first internal interconnect between the first terminal and the first top contact directly below the first terminal; and
   a second internal interconnect including a solder ball between the second terminal and the second top contact directly below the second terminal.

10. The package as claimed in claim 9 wherein the first device has a device encapsulation with a non-planar side.

11. The package as claimed in claim 9 wherein the first device has a stiffener in a device encapsulation.

12. The package as claimed in claim 9 wherein:
   the first device has a first device encapsulation with a first non-planar side; and
   the second device has a second device encapsulation with a second non-planar side complementary to the first non-planar side.

13. The package as claimed in claim 9 further comprising a package encapsulation to cover the first device and second device.

14. The package as claimed in claim 9 wherein:
   the substrate is a laminate substrate; and
   the first internal interconnect is a solder paste.

15. The package as claimed in claim 9 further comprising:
   a first device encapsulation covering the first device and partially exposing the first device terminal, the first device encapsulation having a first terminal level and a first recess level; and
   a second device encapsulation covering the second device and partially exposing the second device terminal, the second device encapsulation having a second terminal level and a second recess level.

16. The package as claimed in claim 11 wherein:
the stiffener is connected to a ground connection for providing an electromagnetic shield.

* * * * *